United States Patent
Ikagawa et al.

(10) Patent No.: US 8,953,650 B2
(45) Date of Patent: Feb. 10, 2015

(54) METHOD TO CONTROL EMISSION WAVELENGTH OF TUNABLE LASER DIODE

(71) Applicant: Sumitomo Electric Industries, Ltd., Osaka-shi (JP)

(72) Inventors: Tomoko Ikagawa, Yokohama (JP); Keiji Tanaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/653,958

(22) Filed: Oct. 17, 2012

(65) Prior Publication Data

US 2013/0094528 A1 Apr. 18, 2013

(30) Foreign Application Priority Data

Oct. 18, 2011 (JP) .................................. 2011-228746

(51) Int. Cl.
| | |
|---|---|
| H01S 3/10 | (2006.01) |
| H01S 5/06 | (2006.01) |
| H01S 5/0625 | (2006.01) |
| H01S 5/0687 | (2006.01) |
| H01S 5/024 | (2006.01) |
| H01S 5/026 | (2006.01) |
| H01S 5/12 | (2006.01) |

(52) U.S. Cl.
CPC ................ *H01S 3/10* (2013.01); *H01S 5/0612* (2013.01); *H01S 5/06256* (2013.01); *H01S 5/0687* (2013.01); *H01S 5/02415* (2013.01); *H01S 5/0265* (2013.01); *H01S 5/06258* (2013.01); *H01S 5/1212* (2013.01)
USPC ............................................................ 372/20

(58) Field of Classification Search
CPC ..... H01S 3/10; H01S 5/02415; H01S 5/0265; H01S 5/1212; H01S 5/06256; H01S 5/06258
USPC ...................................................... 372/50.11
See application file for complete search history.

(56) References Cited

U.S. PATENT DOCUMENTS

| | | | | |
|---|---|---|---|---|
| 2009/0021238 | A1* | 1/2009 | Ishikawa et al. | 324/95 |
| 2010/0272133 | A1* | 10/2010 | Kato | 372/20 |

FOREIGN PATENT DOCUMENTS

| | | |
|---|---|---|
| JP | 2003-198054 | 7/2003 |
| JP | 2007-201425 | 8/2007 |

* cited by examiner

*Primary Examiner* — Tuan Nguyen
(74) *Attorney, Agent, or Firm* — Venable LLP; Michael A. Sartori; Tamatane J. Aga (57) ABSTRACT

A method to control the emission wavelength of a tunable laser diode (LD) is disclosed. The method measures the first derivative of the wavelength against the first stimulus, typically a current injected in the SG-DFB region, and the second derivative of the wavelength against the power supplied to the heater in the CSG-DBR region. The method adjusts the current so as to coincide the emission wavelength with the target wavelength, then, corrects the target power for the heater based on the derivative of the current multiplied by a ratio of two derivatives measured in advance to the control of the heater current.

15 Claims, 6 Drawing Sheets

METHOD TO CONTROL EMISSION WAVELENGTH OF TUNABLE LASER DIODE

BACKGROUND OF THE INVENTION

1. Field of the Invention

The present application relates to a method to control a tunable laser diode (hereafter denoted as LD).

2. Related Background Art

An apparatus to control an emission wavelength of a tunable LD has been known, where the apparatus includes a thermo-electric cooler (hereafter denoted as TEC) that mounts a tunable LD and a temperature sensor such as a thermister thereon. The apparatus performs a sequence to sense a temperature of the tunable LD, and to feedback this sensed temperature to the TEC to adjust the temperature of the tunable LD. The wavelength division multiplexing (hereafter denoted as WDM) system under developing requires precise control of the emission wavelength of an LD as an optical signal source.

In another aspect of the optical communication system, a tunable LD whose emission wavelength is precisely adjustable to a target wavelength, which is one of the grid wavelengths of the WDM system, has been attracted. Conventional tunable LDs generally configure with a gain region having a gain spectrum with a plurality of peaks and a wavelength selective region generally having a reflection spectrum with a plurality of reflection peaks. Such a tunable LD may emit light with an emission wavelength at which one of gain peaks attributed to the gain region coincides with one of reflection peaks attributed to the wavelength selective region. Tuning the gain region, for instance, by varying a current injected thereinto and the wavelength selective region, for instance, by varying a local temperature thereof, and varying a temperature of the tunable LD, the tunable LD may emit light with the target wavelength.

Such a tuning of the emission wavelength generally requires a time until the emission wavelength becomes stable at the target wavelength. One standard set in the optical source for the WDM system requires the switching of the target wavelength, that is, from receiving the command to switch the target wavelength to stabilizing the wavelength at the target one to be several tenses of milli-seconds at most. The TEC generally dominates the switching of the emission wavelength, which sometimes requires several seconds.

SUMMARY OF THE INVENTION

An aspect of the present application relates to a method to control an emission wavelength of a tunable LD, which may configure with a sampled grating distributed feedback (SG-DFB) region as the first region and a chirped sampled grating distributed Bragg reflector (CSG-DBR) region as the second region. The first regions may be stimulated with a current as the first stimulus to tune the emission wavelength, while, the second region may be stimulated with heat as the second stimulus to tune the emission wavelength. A feature of the method is that: (a) calculates a first derivative of the emission wavelength against the first stimulus and a second derivative of the emission wavelength against the second stimulus; (b) adjusting the first stimulus by a first deviation to coincide the emission wavelength with a target wavelength; (c) adjusting a target stimulus for the second stimulus based on the first deviation of the first stimulus, the first derivative and the second derivative; (d) adjusting the second stimulus by a second deviation to coincide with the second stimulus with the target stimulus.

BRIEF DESCRIPTION OF THE DRAWINGS

The foregoing and other purposes, aspects and advantages will be better understood from the following detailed description of a preferred embodiment of the invention with reference to the drawings, in which:

FIG. 2A shows a relation of an emission wavelength of the tunable LD against the tuning current and the heater temperature, and FIG. 2B magnifies one band of the relation where the emission wavelength is determined by one of the gain peaks determined by the tuning current and one of the reflection peaks determined by the heater temperature;

DESCRIPTION OF THE PREFERRED EMBODIMENTS

Next, some embodiments for controlling an emission wavelength of a tunable LD according to the present invention will be described as referring to accompany drawings. In the explanation of the drawings, numerals or symbols same or similar to each other will refer to elements same or similar to each other without overlapping explanations.

Figure 1:
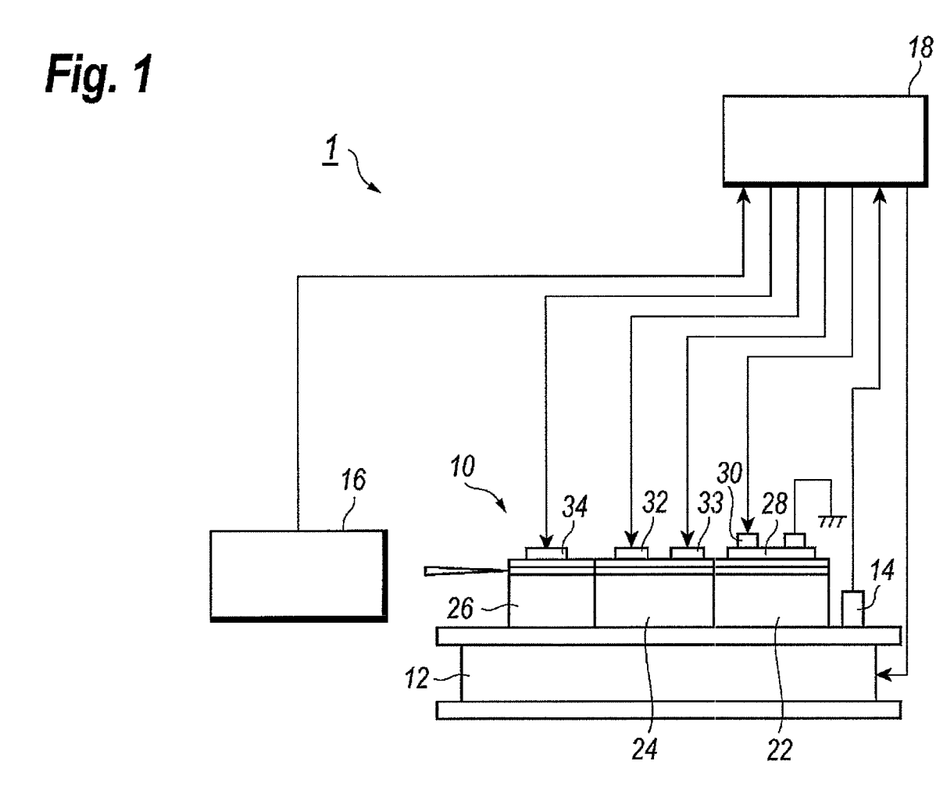
FIG. 1 schematically shows a functional block diagram of an apparatus for controlling a tunable LD according to an embodiment of the invention.

FIG. 1 schematically illustrates functional blocks of a tunable LD and an apparatus 1 including the tunable LD 10 to operate the tunable LD 10 according to an embodiment of the invention. The apparatus 1 includes a thermo-electric cooler (TEC) 12, typically a Peltier device, to control a temperature of the tunable LD 10 placed thereon, a temperature sensor 14, typically a thermistor, to sense a temperature of the tunable LD 10, a wavelength monitor 16 to monitor an emission wavelength of the tunable LD 10, and a controller 18 to control the emission wavelength and the optical output power of the tunable LD 10. Although, the apparatus 1 shown in FIG. 1 places the wavelength monitor 16 in the front of the tunable LD 10, the apparatus 1 may place the wavelength monitor 10 in the rear of the tunable LD 10 to detect a back facet light.

The wavelength monitor 16 includes two photo detectors, one of which detects light coming directly from the tunable LD 10 without intervening any optical device whose optical characteristics depend on wavelengths; while, the other detect the light by intervening an optical device with a wavelength dependent characteristics, typically an etalon filter. The apparatus 1 may detect a shift of the emission wavelength of the tunable LD 10 because an etalon filter has a periodic transmittance and the other photo detector varies an output thereof corresponding to the transmittance of the optical device. The outputs of two photo detectors are provided to the controller 18.

Next, the tunable LD 10, whose emission wavelength is a subject to be controlled, will be described in an arrangement thereof. The tunable LD 10 of the embodiment includes a chirped sampled grating distributed Bragg reflector (hereafter denoted as CSG-DBR) region 22 as a second region, a sampled grating distributed feedback (hereafter denoted as SG-DFB) regions 24 as a first region, and a semiconductor optical amplifier (hereafter denoted as SOA) region 26, where these regions, 22 to 26, are arranged along the optical axis thereof in this order. Two regions of the CSG-DBR region 22 and the SG-DFB region 24 contribute the tuning of the emission wavelength.

The CSG-DBR region 22 includes an optical waveguide providing a plurality of grating regions each having an optical grating and being apart by spaces, by which the CSG-DBR region 22 shows a reflectance spectrum with a plurality of reflection peaks. The span between the reflection peaks attributed to the CSG-DBR region 22 is slightly different from a space between the gain peaks attributed to the SG-DFB regions 24, which will be described in detail later. Then, the tunable LD 10 may emit light with the wavelength at which one of reflection peaks of the CSG-DBR region 22 coincides with one of gain peaks of the SG-DFB region 24. The CSG-DBR region 22 provides a heater 28 monolithically integrated thereon. The controller 18, by supplying electrical power to the heater 28 as a second stimulus for the CSG-DBR region 24, modifies refractive index of the optical waveguide in the CSG-DBR region 22, which shifts the wavelengths of the reflection peaks and one of the peak wavelengths becomes coincides with the wavelength of the gain peaks attributed to the SG-DFB region 24. The reflection peaks and the gain peaks shift the wavelengths thereof dependent on an operating temperature of the tunable LD 10.

The SG-DFB region 24 will be described. The SG-DFB region 24 also includes an optical waveguide provided with a plurality of gain regions and a plurality of tuning regions. Each of the gain regions provides an optical grating; while, the tuning regions provide no optical grating. These gain regions and the tuning regions are alternately arranged along the optical axis of the tunable LD 10. The SG-DFB region 24 thus configured shows a gain spectrum with a plurality of gain peaks with a predetermined span. The SG-DFB region 24 further provides two type of electrodes, 32 and 33, the former of which injects a driving current into the gain region, while, the latter injects another current, namely a tuning current, into the tuning region. The refractive index of the tuning region may be modified by the injected current as a first stimulus, then the peak wavelength may be shifted and the span therebetween may be faintly modified. The wavelengths of the gain peaks, and the span therebetween may be also varied depending on the operating temperature of the tunable LD 10.

The SOA 26 also includes an optical waveguide and an electrode 34 to control the amplification factor of the waveguide in the SOA 26. Injecting carriers from the electrode 34, the amplification factor of the optical waveguide in the SOA 26 may be controlled. The optical waveguide in the CSG-DBR region 22, that in the SG-DFB region 24, and that in the SOA 26 are optically coupled to each other.

Figures 2A, 2B:
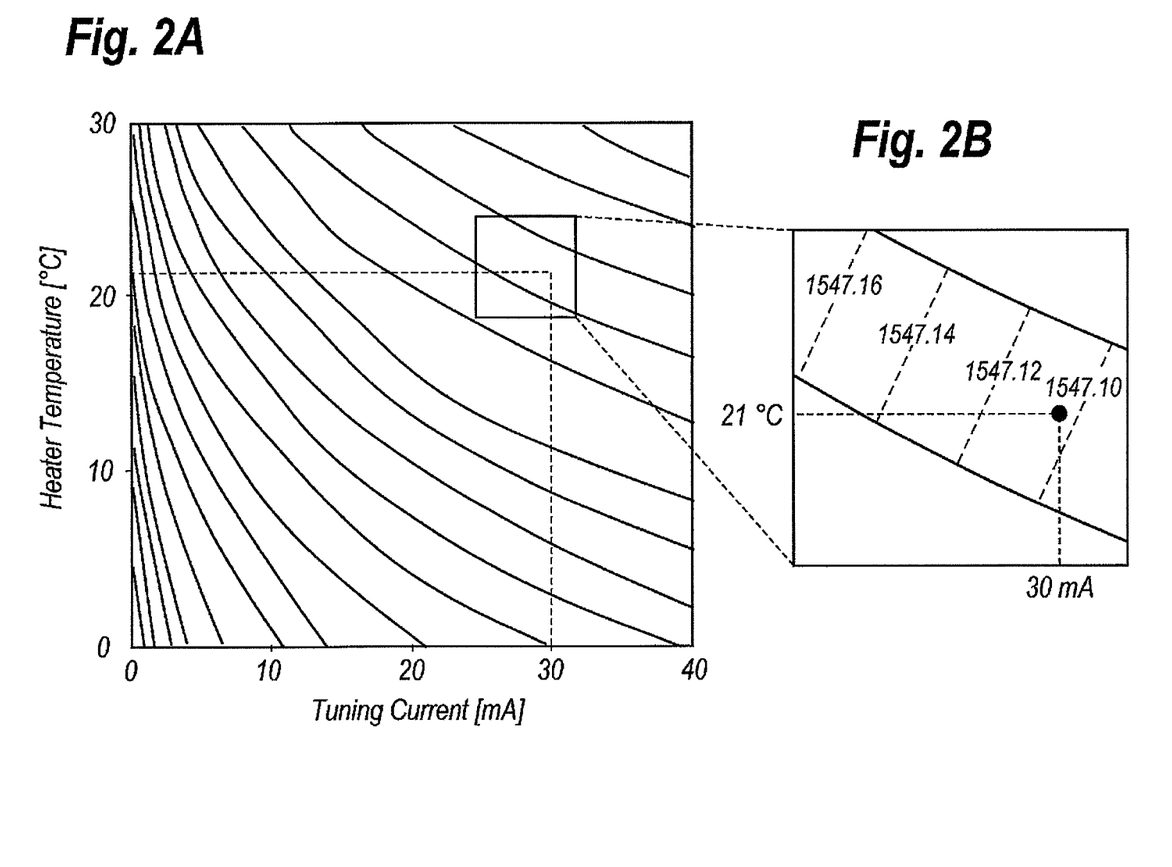

The tunable LD 10 of the embodiment thus configured may tune the emission wavelength thereof by controlling the electrical power supplied to the heater 28 in the CSG-DBR region 22 as the second stimulus and the injection current injected into the tuning region as the first stimulus. FIGS. 2A and 2B show behaviors of the emission wavelength Wp of the tunable LD 10 depending on the injection current into the tuning region in the horizontal axis, and the heater temperature in the vertical axis, as the operating temperature of the tunable LD 10 is kept constant.

Solid lines in FIG. 2A denote thresholds at which the emission wavelength hops. That is, in a band region surrounded by two solid curves, which extends from the top left to the bottom right, a combination of the reflection peak and the gain peak is maintained, while, at least one of the reflection peak and the gain peak hops to another at the solid curves to form a new combination.

FIG. 2B magnifies a square portion in FIG. 2A. As shown in FIG. 2B, the emission wavelength Wp shifts longer from the bottom right to the top left within the band region, namely, from 1547.10 to 1547.16 nm. Specifically, raising the heater temperature from 21° C. as keeping the injection current to be 30 mA, the reflection peak hops to another as the emission wavelength Wp shifts only by 0.01 nm. While, reducing the injection current from 30 mA as keeping the heater temperature to be 21° C., the gain peak hops to another as the emission wavelength Wp shifts only by 0.04 nm. Thus, when only one of the heater temperature and the injection current is varied, the emission wavelength Wp does not shift smoothly and stably.

On the other hand, when both of the heater temperature and the injection current are varied as keeping a preset interrelation ship therebetween, for instance, the injection current is reduced by a preset amount while the heater temperature is raised relative to the preset amount, the emission wavelength Wp shifts along a solid line in FIG. 2B as the combination of the gain peak and the reflection peak is maintained. The present embodiment is to provide an algorithm to control the emission wavelength of the tunable LD 10 by setting variably the injection current and the heater temperature which is equivalently power supplied to the heater.

The controller 18 includes a central processing unit (CPU), a random access memory (RAM), a read only memory (ROM), a power supply, a monitoring unit including analog-to-digital converters (A/D-Cs), and so on. These elements in the controller 18 may be separately prepared independent of the controller 18. The RAM and/or ROM holds initial conditions and target conditions as a look-up-table (LUT), where these conditions correspond to the emission wavelength of the tunable LD 10. The outputs of the controller 18 are supplied to respective regions, 22 to 26, of the tunable LD 10 via electrodes, 30 to 34.

The initializing of the tunable LD 10 will be described. The controller 18 first sets the temperature of the tunable LD 10 in the target temperature by controlling the TEC 12 through the temperature sensor 14. This target temperature is maintained independent of the emission wavelength. Then, the controller 18 supplies biases for respective regions, 22 to 26, via electrodes, 30 to 34, where the biases are measured in advance to the practical operation and held in the LUT 20.

Figure 3:
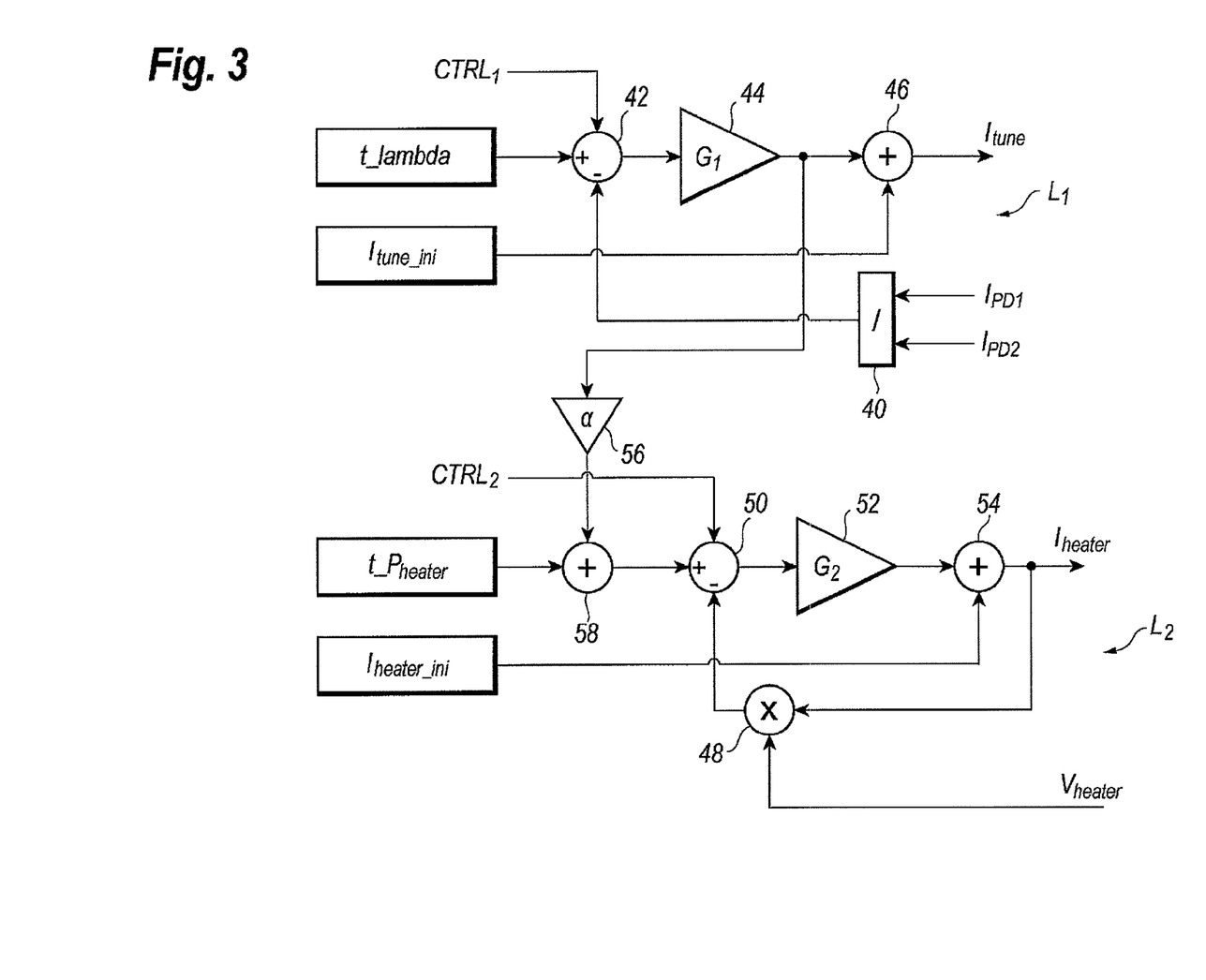
FIG. 3 schematically illustrates a functional arrangement of the controller appeared in FIG. 1.

Under these bias conditions, the emission wavelength is set to be close to the target wavelength, but not always set in just target wavelength within an acceptable range because of a varied ambient temperature, a long-term degradation of the tunable LD 10, and so on. The target wavelength is generally set to be one of the gird wavelengths of the wavelength division multiplexing (WDM) system. Then, the controller 18 is necessary to adjust the emission wavelength by the feedback loop so as to coincide the emission wavelength with the target wavelength within a preset range. FIG. 3 schematically shows a functional block diagram of the feedback loop.

As shown in FIG. 3, the feedback loop includes the first loop $L_1$ and the second loop $L_2$, the former of which includes a divider 40 for calculating a ratio $I_{PD2}/I_{PD1}$ of the outputs of two photo detectors, a subtracter 42 to subtract the ratio $I_{PD2}/I_{PD1}$ from a value t_lambda corresponding to the target wavelength, an amplifier 44 to amplify the subtracted result (t_lambda–$I_{PD2}/I_{PD1}$) by a gain $G_1$, and an adder 46 to increase/decrease an amplified result $G_1 \times$(t_lambda–$I_{PD2}/I_{PD1}$) to/from the initial tuning current $I_{tune\_ini}$ to generate the tuning current $I_{tune}$, which is supplied to the tuning region. In the description, $I_{PD1}$ and $I_{PD2}$ are the photocurrents each output from the photo detectors that detect the optical output directly from the tunable LD 10 and the optical output indirectly through the etalon filter. The value t_lambda corresponds to the ratio $I_{PD2}/I_{PD1}$ when the tunable LD 10 emits light with the target wavelength. Accordingly, the subtracter 42 calculates a difference between the target wavelength and a wavelength of the light which the tunable LD 10 currently emits. The photo detectors in the outputs thereof become faint or zero at the starting-up or during the initialization processes; then the ratio $I_{PD2}/I_{PD1}$ is indefinite. Accordingly, the subtracter 42 outputs zero by the control signal $CTRL_1$. The amplifier 44 has a gain $G_1$ large enough; or the amplifier 44 may be an integrator in an alternative. Because the output of the subtracter 42 is set to be zero as described above, the output of the amplifier 44 is also set to be zero, then the first loop $L_1$ directly outputs the initial tuning current $I_{tune\_ini}$.

Once the tunable LD 10 practically emits light supplied with biases, the system resets the control signal $CTRL_1$ to operate the subtracter 42. Then, the first loop $L_1$ becomes active to set the tuning current $I_{tune}$ supplied to the gain region in a value by which the ratio $I_{PD2}/I_{PD1}$ of the outputs of two photo detectors becomes the target value t_lambda.

The second loop $L_2$ includes a multiplier 48, a subtracter 50, an amplifier 52, and an adder 54. The multiplier 48 evaluates power currently supplied to the heater 28 by detecting the heater voltage $V_{heater}$ caused by the heater current $I_{heater}$ presently flowing in the heater 28. The subtracter 50 subtracts the power currently supplied to the heater 28 from the target power. The amplifier 52 amplifies the output of the subtracter 50 by the gain $G_2$. The adder 54 increases/decreases an amplified result to/from the initial heater current $I_{heater\_ini}$ to evaluate the heater current $I_{heater}$ to be supplied to the heater 28. The amplifier 52 in the second loop $L_2$ also has a gain $G_2$ large enough, or in an alternative, the amplifier 52 may be an integrator. The control signal $CTRL_2$ also sets the output of the subtracter 50 to be zero during the initializing of the second loop $L_2$, which sets the output of the amplifier 50 to be also zero. Then, the second loop $L_2$ outputs the initial heater current $I_{heater\_ini}$ as the heater current $I_{heater}$.

Resetting the control signal $CTRL_2$ to activate the subtracter 50 after the initial heater current $I_{heater\_ini}$ is practically set in the heater, the second loop $L_2$ starts the operation. That is, the subtracter 50 subtracts the target heater power from the currently supplied power, the amplifier 52 amplifies the difference between the target power and the currently supplied power, and the adder 54 increases/decreases the amplified difference of the heater current by the initial heater current $I_{heater\_ini}$ as a reference. Thus, the present embodiment controls the integrated heater based on the power supplied thereto because the control of only one of the heater current and the heater voltage is unable to compensate the degradation of the monolithically integrated heater.

Next, a sequence to control the tunable LD 10 will be described. The controller 18 first sets, by reading the LUT in the memory, the initial conditions of the amplifying current $I_{SOA\_ini}$, the heater current $I_{heater\_ini}$, and the tuning current $I_{tune\_ini}$ in respective regions of the tunable LD 10 to activate practically. At that time, the first loop $L_1$ for the tuning current $I_{tune}$ and the second loop $L_2$ for the heater current $I_{heater}$ are cut the feedback control thereof by setting the control signals, $CTRL_1$ and $CTRL_2$, respectively. The controller 18 further reads the target value t_lambda for the ratio $I_{PD2}/I_{PD1}$ of the outputs of two photo detectors and that t_$P_{heater}$ for the heater.

Setting the initial conditions for the target wavelength, the emission wavelength Wp of the tunable LD is set to be close enough to the target wavelength, and the ratio $I_{PD2}/I_{PD1}$ of the outputs of two photo detectors is also set to be close to the target value t_lambda.

Then, activating the feedback loops, $L_1$ and $L_2$, by negating respective control signals, $CTRL_1$ and $CTRL_2$, the controller 18 starts the operation to coincide the emission wavelength Wp of the tunable LD 10 precisely with the target wavelength. The second loop $L_2$ provides an amplifier 56 and the adder 58 to determine a target condition of the heater power. The gain of this amplifier 56 is set to be, for instance, $\alpha$ in advance to the practical operation. The gain $\alpha$ may be determined through two parameters, a and b, where a is given by a derivative of the emission wavelength against the tuning current, $a=\Delta\lambda/\Delta I_{tune}$; while, b is given by a derivative of the emission wavelength against the heater power, $b=\Delta\lambda/\Delta P_{Heater}$. Based on the behaviors of the emission wavelength against the tuning current $I_{tune}$ and the heater temperature $T_{heater}$ shown in FIG. 2, the gain $\alpha$ (=a/b) may be measured in advance to the practical operation of the apparatus 1 and stored in the memory as a LUT.

The amplifier 56 multiplies the output of the amplifier 44, which is the deviation of the ratio $I_{PD2}/I_{PD1}$ of the outputs of two photo detectors from the target value t_lambda but amplified by the amplifier 44, by the gain $\alpha$, and adds the output thereof to the target power t_$P_{heater}$. This means that, assuming the deviation of the tuning current $\Delta I_{tune}$/a to cause a preset wavelength shift $\Delta\lambda$, the deviation of the heater power to cause the same preset wavelength shift $\Delta\lambda$ becomes $\Delta P_{Heater}$/b. The adder 58 in the second loop $L_2$ adds this deviation, the deviation of the tuning current $\Delta I_{tune}$ multiplied by the ratio of two derivatives a/b to the target power t_$P_{heater}$ to adjust the target power t_$P_{heater}$. The subtracter 50 subtracts the current heater power from the adjusted target heater power, t'_$P_{heater}$=$\alpha \times G_1 \times$(t_lambda–$I_{PD2}/I_{PD1}$)+t_$P_{heater}$. Thus, the second loop $L_2$ performs the feedback control for the heater based on the adjusted target power t'_$P_{heater}$ that reflects the deviation of the tuning current from the target value.

In the present embodiment, the first loop $L_1$ has a response, which is a time from a supplement of a revised tuning current to a shift of the emission wavelength, longer than a response of the second loop $L_2$, which is a time from a supplement of a revised heater current to a shift of the emission wavelength. This is because, the first loop determines the tuning current $I_{tune}$ by adding a deviation from the target current to the initial tuning current $I_{tune\_ini}$, and the tuning current $I_{tune}$ is supplied to the SG-DFB region 24 that shows a quite fast response from the carrier injection to the change of the refractive index or to the shift of the emission wavelength. While, the second loop first adjusts the target heater power based on the result obtained in the first loop $L_1$ and the amplifier 56, then calculates the deviation of the current heater power from this adjusted target power. The heater provided in the CSG-DBR region 22 of the present embodiment shows relatively fast response because of a reduced size thereof with a limited thermal capacity to be heated. Accordingly, the response of the second loop $L_2$ depends on time constants attributed to other elements. Thus, the time constant of the first loop $L_1$ is set to be longer than that of the second loop $L_2$ to operate two feedback loops, $L_1$ and $L_2$, stably. The SG-DFB region 24 and the CSG-DBR region 22 each is controlled by respective loops, $L_1$ and $L_2$, attributed with the time constants different from others.

Specifically, the closed loop gain of the first loop $L_1$ is smaller than that of the second loop $L_2$. The gain $G_1$ of the amplifier 44 in the first loop $L_1$ substantially determines the response of the SG-DFB region 24, while, the gain $G_2$ of the amplifier 52 affects the response of the second loop $L_2$. Thus, the response of the loops, $L_1$ and $L_2$, are easily adjusted by varying the gain of the amplifiers, 44 and 52. For instance, setting the maximum deviation of the tuning current $I_{tune}$ for respective cycles of the loop small enough, where the deviation is added to the initial tuning current $I_{tune\_ini}$, the response of the first loop $L_1$ in the time constant thereof becomes longer.

An alternative may set a period to monitor the emission wavelength longer in the first loop $L_1$, and set a process to calculate parameters based on this monitoring longer compared with a process to calculate parameters based on the heater current and the heater voltage in the second loop $L_2$. Still another alternative may set the period to monitor the emission wavelength in the first loop $L_1$ substantially equal to a period to monitor the heater voltage in the second loop $L_2$, and set a frequency to calculate parameters done after the monitoring in the first loop $L_1$ less than a frequency to calculate parameters in the second loop $L_2$. The setting of the loop gain of the first loop $L_1$ and that of the second loop $L_2$ may be done together with the setting of the frequency of the calculation in the first and second loops, $L_1$ and $L_2$.

Next, the sequence to control the tunable LD 10 in the apparatus 1 will be described as referring to FIGS. 4A and 4B.

Figure 4A:
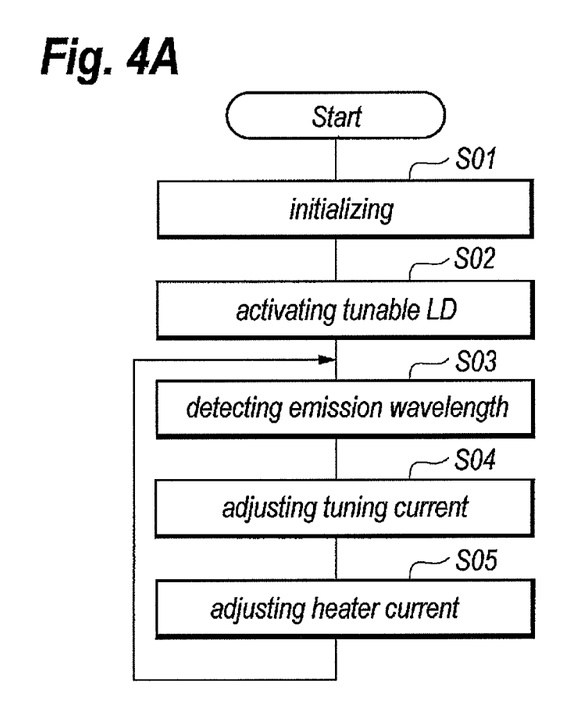
FIG. 4A is a flow chart of the control sequence of the emission wavelength of the tunable LD.

FIG. 4A is a flow chart that sequentially performs the first loop $L_1$ to control the tuning current $I_{tune}$ and the second loop $L_2$ to control the heater current $I_{heater}$. The sequence of FIG. 4A first evaluates the tuning current $I_{tune}$ for the wavelength shift $\Delta\lambda$ by one cycle of the first loop $L_1$; then, this evaluated current is not only provided to the next cycle of the first loop $L_1$ but used for calculating the target heater power $\Delta I_{Heater}$ combined with the gain α. The sequence shown in FIG. 4A assumes that the operation is done digitally.

Starting the operation for the tunable LD 10, initial conditions read from the LUT 20, such as the initial tuning current $I_{tune\_ini}$, the initial heater current $I_{heater\_ini}$ and so on, are set in the tunable LD 10 at step S01. During step S01, two control signals, $CTRL_1$ and $CTRL_2$, are asserted to provide the initial conditions above to respective regions in feed-forward under the open loop mode. The tunable LD 10, being provided with initial conditions, emits light with a wavelength close to the target wavelength provided from the outside of the control loops, $L_1$ and $L_2$, at step S02.

Negating two control signals, $CTRL_1$ and $CTRL_2$, two control loops, $L_1$ and $L_2$, start respective feedback controls to coincide the emission wavelength with the target wavelength.

Specifically, the controller 18 monitors the output of two photo detectors, $I_{PD1}$ and $I_{PD2}$, and calculates the ratio $I_{PD2}/I_{PD1}$ therebetween to determine the current emission wavelength at step S03. Then, the controller 18 adjusts or modifies the deviation of the tuning current $\Delta I_{tune}$ to coincide the emission wavelength with the target wavelength at step S04. Subsequently, the controller 18 calculates the target heater power based on the deviation of the tuning current $\Delta I_{tune}$ and the gain a at step S05. The controller 18 performs step S03 after the revised heater power is set to the heater. Thus, the controller 18 may make the emission wavelength to coincide with the target wavelength by circulating steps from S03 to S05.

Figure 4B:
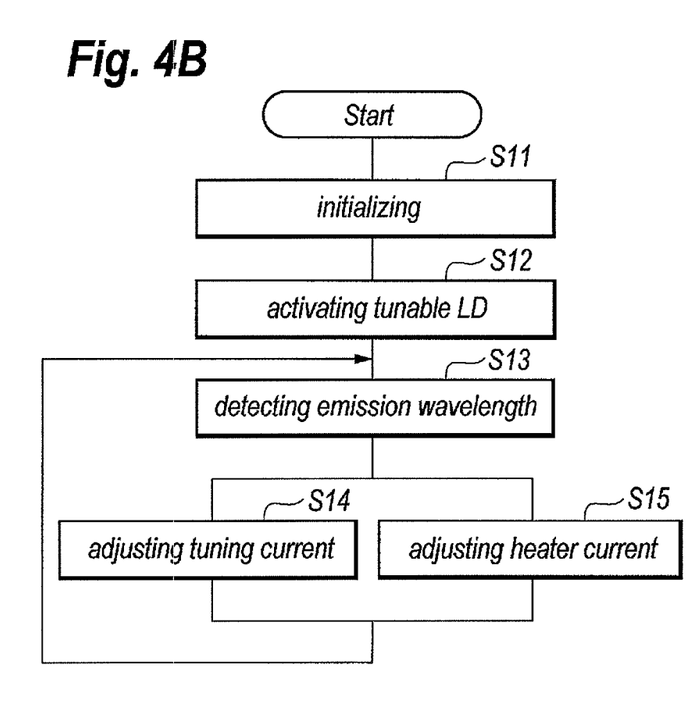
FIG. 4B is another flow chart of the control sequence.

In an alternative, the controller 18 may perform two loops, $L_1$ and $L_2$, concurrently as shown in FIG. 4B. In the sequence, the first loop $L_1$ evaluates the deviation of the tuning current $\Delta I_{tune}$ and sets the target heater power based on the this deviation of the tuning current $\Delta I_{tune}$ same as the sequence shown in FIG. 4A, but the first loop $L_1$ starts the next cycle at step S14 independent of the setting of the revised heater power at step S15 because the time constant of the second loop $L_2$ is shorter than that of the first loop $L_1$. The controller 18 may make the emission wavelength of the tunable LD 10 to coincide with the target wavelength by iterating steps S13 to S15.

Thus, the method according to one embodiment of the invention controls the tuning current $I_{tune}$ supplied to the SG-DFB region 24 such that the current emission wavelength coincides with the target wavelength and the heater current $I_{heater}$ supplied to the CSG-DBR region 22 such that the target heater power $t\_P_{heater}$ is determined by calculating the ratio α of the derivative b of the wavelength against the heater current and another derivative a of the wavelength against the tuning current (α=b/a) first, and by multiplying thus calculated ratio α with the deviation of the tuning current $\Delta I_{tune}$ second. The method of the embodiment may perform the feedback control for the tuning current concurrently with the feedback control for the heater current, which enables the emission wavelength of the tunable LD to coincide with the target wavelength promptly and stably.

The time constant of the first feedback loop $L_1$ for the tuning current is set to be longer than the time constant of the second feedback loop $L_2$ for the heater power, which enables the response of the emission wavelength against the tuning current to be close to the response against the heater power. When the first feedback loop $L_1$ for the tuning current and the second feedback loop $L_2$ for the heater power are sequentially performed, the target heater power is stably set for the current emission wavelength, which makes the control for the emission wavelength promptly.

The present invention is not restricted to those embodiments described above. For instance, the tunable LD 1 may provide a function to correct the initial heater power. Sequences shown in FIGS. 5A and 5B add a sequence to correct the initial heater power to sequences shown in FIGS. 4A and 4B, respectively. Steps in FIG. 5A except for steps S23, S24, S28, and S29 correspond to steps S01 to S05 in FIG. 4A, while, steps in FIG. 5B except for steps S43, S44, S48, and S49 correspond to steps S11 to S15 in FIG. 4B.

Figure 5A:
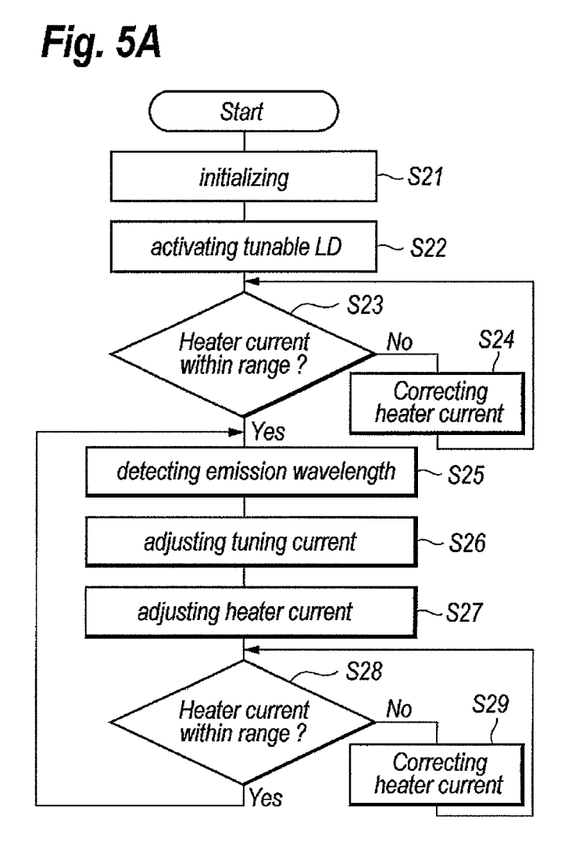
FIGS. 5A and 5B are flow charts of the control sequence of the emission wavelength of the tunable LD according to modified embodiments of the invention.
Figure 5B:
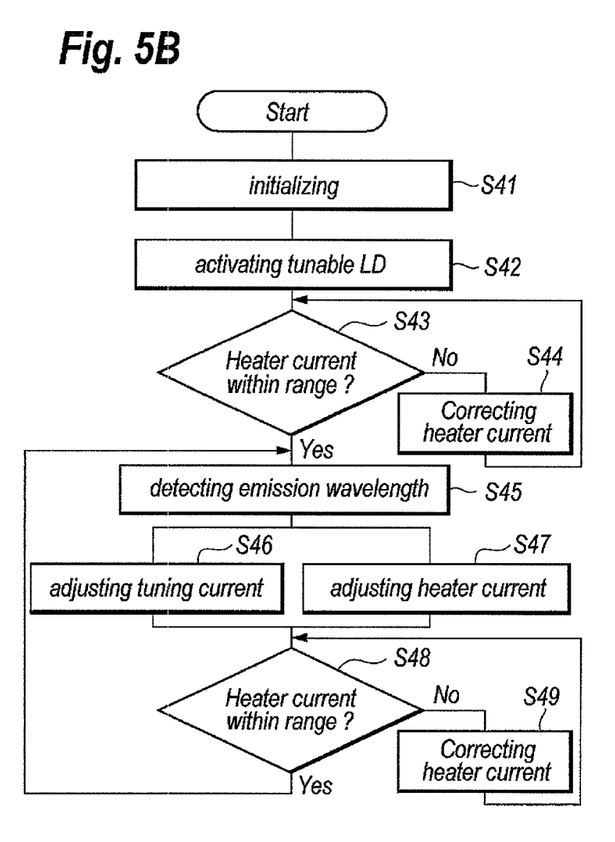

Because the heater 28 inherently shows long term degradation, that is, the heater 28 gradually increases/decreases the resistance thereof When such degradation occurs, for instance, the resistance of the heater 28 varies to $R_{heater}'$ from $R_{heater}$, the heater power set by the initial heater current $I_{heater\_ini}$ is given by:

$$P'_{heater} = I_{heater\_ini} \times V'_{heater\_ini}$$
$$= I^2_{heater\_ini} \times R'_{heater},$$

which deviates from the target heater power $t\_P_{heater}$. Step S23 in FIG. 5A, or step S43 in FIG. 5B checks whether the heater power is within an acceptable range after the tunable LD 10 is practically activated. When the heater power is out of the range, step S24 or step S44 carries out to correct the heater power, then the practical control to coincide the emission wavelength with the target wavelength. Even the heater shows the long term degradation, the control of the emission wavelength may be securely carried out. Moreover, as steps S28 and S29 in FIG. 5A or step S48 and S49 in FIG. 5B, the sequence may add steps to check the heater power after the control of the emission wavelength.

The sequence according to embodiments thus described configures with, what is called, the dual loop of the first loop $L_1$ for the tuning current and the second loop $L_2$ for the heater current. The heater 28 of the present invention is monolithically integrated in the tunable LD 10, which the second loop $L_2$ shows relatively faster response even the loop $L_2$ controls the electrical power. The first loop $L_1$ for the tuning current is intentionally set in relatively greater time constant compared with that of the second loop $L_2$ to stabilize the dual loop control.

Figure 6:
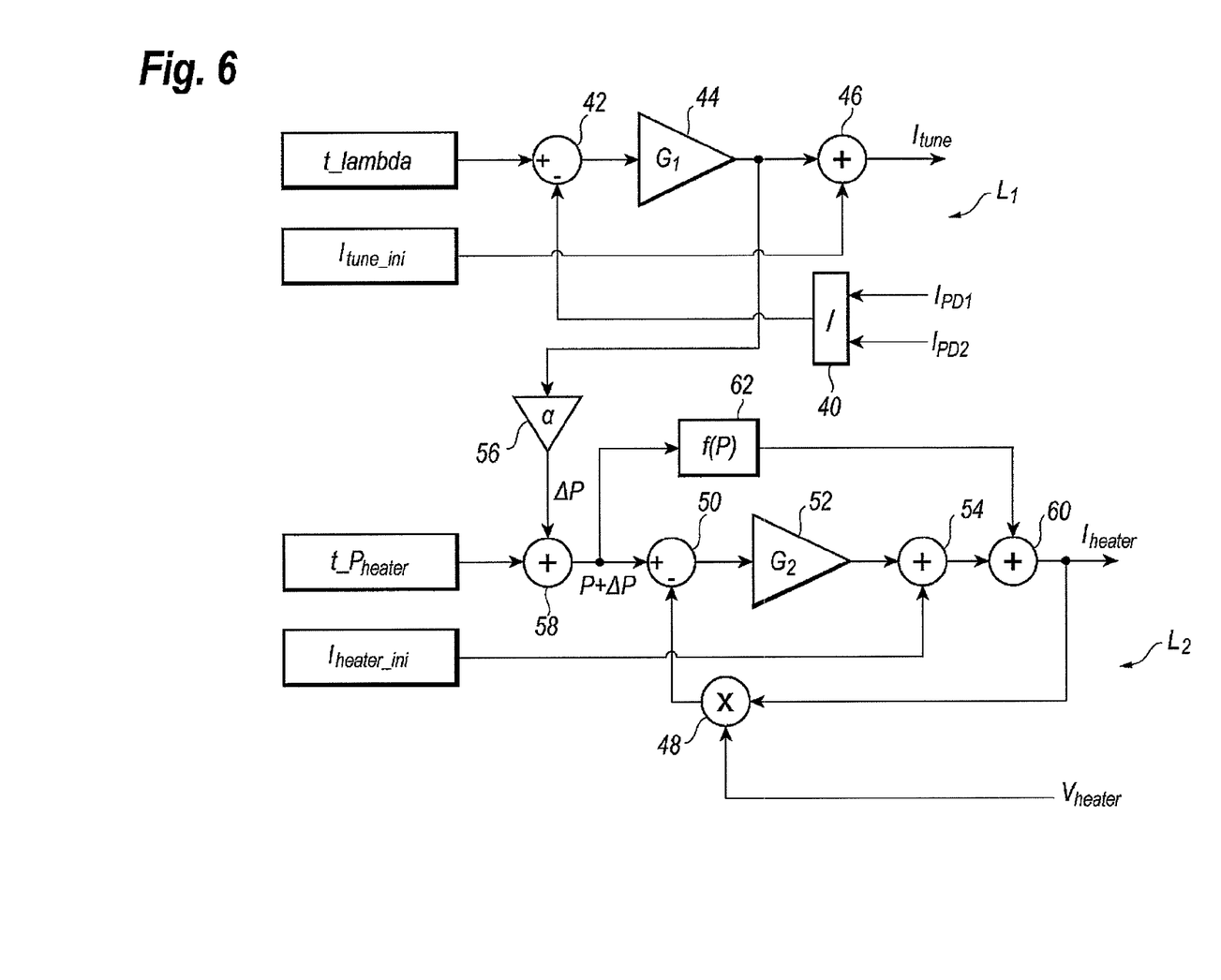
FIG. 6 schematically shows a function block diagram of another apparatus according to another embodiment of the invention.

In order to accelerate the dual loop control, the second loop $L_2$ is necessary to respond promptly. FIG. 6 shows a functional block diagram of the dual loop control where the second loop $L_2$ for the heater current is accelerated. Specifically, the second loop $L_2$ includes, in addition to the arrangement shown in FIG. 3, an adder 60 and a functional unit 62. The deviation of the target heater power $\Delta P$ is firstly calculated based on the deviation of the tuning current $\Delta I_{tune}$ and the wavelength derivative ratio $\alpha(=b/a)$ in FIG. 3; then, the second loop $L_2$ revises the target heater power to $t\_P_{heater}+\Delta P$. When the resistance R of the heater is known in advance to the practical operation, the heater current $I_{heater}$ and the deviation $\Delta I_{heater}$ thereof provided to the heater have a relation of:

$$P+\Delta P=(I_{heater}+\Delta I_{Heater})^2 \times R.$$

Then, the deviation of the heater current $\Delta I_{heater}$ becomes:

$$\Delta I_{heater} = \sqrt{\{(P+\Delta P)/R\}} - \sqrt{(P/R)}$$
$$= f(P).$$

The functional unit 62 performs the above arithmetic. This deviation of the heater current $\Delta I_{heater}$ is added in the output of the second loop $L_2$ in feed forward, the response of the second loop $L_2$ may be accelerated.

In the foregoing detailed description, the method of the present invention has been described with reference to specific exemplary embodiments thereof It will, however, be evident that various modifications and changes may be made thereto without departing from the broader spirit and scope of the present invention. For instance, the embodiments describes that the SG-DFB region as the first region is stimulated to tune the emission wavelength by the injection current as the first stimulus. However, the SG-DFB region may provide a heater to tune the emission wavelength and the heater may be stimulated by the electric power supplied thereto. The present specification and figures are accordingly to be regarded as illustrative rather than restrictive.

What is claimed is:

1. A method to control an emission wavelength of a tunable laser diode (LD) that provides a first region attributed to tune the emission wavelength of the tunable LD by a first stimulus and a second region attributed to tune the emission wavelength of the tunable LD by a second stimulus, the method comprising steps of:
    calculating a first derivative of the emission wavelength against the first stimulus supplied to the first region and a second derivative of the emission wavelength against the second stimulus supplied to the second region;
    adjusting the first stimulus for a first deviation so as to make the emission wavelength coincident with a target wavelength;
    adjusting a target stimulus for the second stimulus based on the first deviation of the first stimulus, the first derivative and the second derivative; and
    adjusting the second stimulus for a second deviation so as to make the second stimulus coincident with the target stimulus,
    wherein the tunable LD is mounted on a thermo-electric cooler (TEC), and
    wherein the method performs the steps of adjusting the first stimulus, the target stimulus, and the second stimulus as keeping a temperature of the TEC in constant.

2. The method of claim 1,
    wherein the step of adjusting the first stimulus is done by a first path and the step of adjusting the second stimulus is done by a second path, and
    wherein the first path has a time constant longer than a time constant of the second path.

3. The method of claim 2,
    wherein the first path has a first gain smaller than a second gain of the second path.

4. The method of claim 1,
    wherein the steps of adjusting the first stimulus, the target stimulus and the second stimulus are sequentially iterated.

5. The method of claim 4,
    wherein the step of adjusting the first stimulus is done after the step of adjusting the second stimulus.

6. The method of claim 4,
    wherein the step of adjusting the first stimulus is done after the step of adjusting the target stimulus independent of the step of adjusting the second stimulus.

7. The method of claim 1,
    wherein the first stimulus is a current injected into the first region.

8. The method of claim 7,
    wherein the first region includes a sampled grating distributed feedback (SG-DFB) region whose gain spectrum has a plurality of peaks at wavelengths depending on the current injected therein.

9. The method of claim 1,
    wherein the second stimulus is a heat supplied to the second region.

10. The method of claim 9,
    wherein the second stimulus is a current supplied to a heater monolithically integrated in the second region.

11. The method of claim 10,
    wherein the second region includes a chirped sampled grating distributed Bragg reflector (CSG-DBR) region whose reflection spectrum has a plurality of peaks at wavelengths depending on heat generated by the heater.

12. The method of claim 10,
    further including a step of correcting heater power after the step of evaluating the first derivative and the second derivative.

13. The method of claim 10,
    further including a step of correcting heater power after the step of providing the second deviation.

14. The method of claim 1,
    further including steps of,
    evaluating the second stimulus based on the target stimulus, and
    providing the second stimulus to the second region.

15. A method to control an emission wavelength of a tunable laser diode (LD) that provides a first region attributed to tune the emission wavelength by a first stimulus and a second region attributed to tune the emission wavelength by a current supplied to a heater that is monolithically formed in the second region, the method comprising steps of:

calculating a first derivative of the emission wavelength against the first stimulus provided to the first region and a second derivative of the emission wavelength against the current supplied to the heater in the second region as correcting heater power;

adjusting the first stimulus by a first deviation so as to make the emission wavelength coincident with a target wavelength;

adjusting a target stimulus for the current based on the first deviation of the first stimulus, the first derivative and the second derivative; and adjusting the current so as to be coincident with the target stimulus based on a second deviation, wherein the tunable LD is mounted on a thermo-electric cooler (TEC), and wherein the method performs the steps of adjusting the first stimulus, the target stimulus, and the second stimulus as keeping a temperature of the TEC in constant.

* * * * *